(12) United States Patent
Dasani et al.

(10) Patent No.: US 10,147,482 B2
(45) Date of Patent: Dec. 4, 2018

(54) SKEWED CORNER TRACKING FOR MEMORY WRITE OPERATIONS

(71) Applicant: ARM Limited, Cambridge (GB)

(72) Inventors: Jitendra Dasani, Cupertino, CA (US); Vivek Nautiyal, Milpitas, CA (US); Shri Sagar Dwivedi, San Jose, CA (US); Fakhruddin Ali Bohra, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/462,549

(22) Filed: Mar. 17, 2017

(65) Prior Publication Data

US 2018/0268894 A1 Sep. 20, 2018

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC .... G11C 11/419; G11C 11/418; G11C 11/412
USPC .......... 365/154, 156, 189.14, 210.1
See application file for complete search history.

(56) References Cited

U.S. PATENT DOCUMENTS

| | | | |
|---|---|---|---|
| 9,583,181 B1* | 2/2017 | Aggarwal | G11C 11/412 |
| 2012/0250430 A1* | 10/2012 | Ghassemi | G11C 11/412 365/189.16 |
| 2015/0213881 A1* | 7/2015 | Rai | G11C 11/419 365/154 |
| 2015/0215881 A1* | 7/2015 | Parkvall | H04W 56/002 370/350 |

* cited by examiner

*Primary Examiner* — David Lam
(74) *Attorney, Agent, or Firm* — Pramudji Law Group PLLC; Ari Pramudji

(57) ABSTRACT

A memory device includes a bitcell array having a plurality of bitcells, a dummy wordline, a dummy row cell pulldown, and a write tracker coupling the dummy wordline to the dummy row cell pulldown. The write tracker is configured as a transmission gate during a read operation on the bitcell array, and is configured as having only one or more active nMOSFETs during a write operation on the bitcell array.

18 Claims, 2 Drawing Sheets

SKEWED CORNER TRACKING FOR MEMORY WRITE OPERATIONS

BACKGROUND

In a memory, such as for example an SRAM (Static Random Access Memory), the CLK2Q (clock-to-data) time may vary across process corners. Utilizing a dummy word line connected to a dummy row cell pulldown with a dummy bit line is an approach to tracking variations in CLK2Q to improve read and write margins, where a controller enables reading of the bitlines based upon the dummy bitline being pulled LOW on a write or read operation. However, this approach does not always meet the desired write margin for a SF (Slow-Fast) process corner where nMOSFETs (Metal Oxide Semiconductor Field Effect Transistor) are slow and pMOSFETs are fast.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
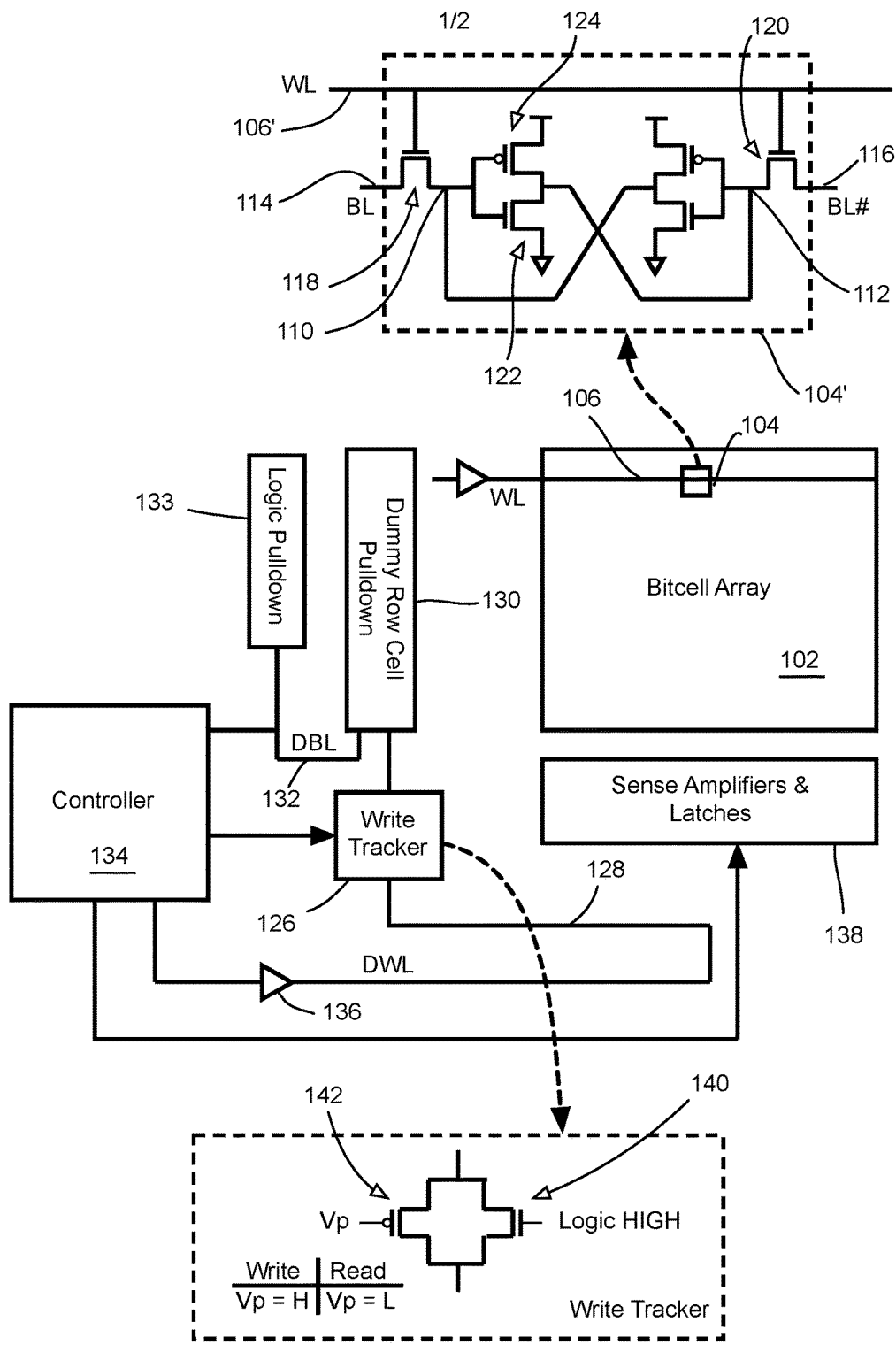
FIG. 1 illustrates a memory with a write tracker in accordance with various implementations described herein.

Embodiments described herein track write operations performed on memory cells to improve write margin in an SF corner. FIG. 1 illustrates components of a memory according to various embodiments described herein. For ease of illustration, not all components commonly found in a typical memory are shown. For example, bitline precharge circuits and address decoders are well-known to those of ordinary skill in the art of memory circuit design, but are not shown in FIG. 1 so as not to obscure the components relevant to the description of embodiments.

A bitcell array 102 comprises an array of bitcells, where each row of bitcells is accessed by a wordline. For example, illustrated in FIG. 1 is a bitcell 104 with its associated wordline 106. The memory illustrated in FIG. 1 may be an SRAM, where for example the bitcell 104 may be a 6T (6-Transistor) SRAM bitcell 104'. Various embodiments described herein are not necessarily limited to memories with 6T SRAM bitcells, and are not necessarily limited to static memories.

Referring to the bitcell 104', during a write operation an internal node 110 or 112 is pulled LOW depending upon the logic value to be written as provided on a bitline 114 and its complement 116. As a specific example, consider the case that before some write operation, the node 110 is HIGH and the node 112 is LOW, and that during the write operation the wordline 106 (illustrated as 106' with respect to the 6T SRAM bitcell 104') is asserted HIGH so that the access nMOSFETs 118 and 120 are switched ON, where the bitline 114 is HIGH and the complementary bitline 116 is LOW. This write operation changes the logical value of the bitcell 104' so that the pulldown nMOSFET 122 is switched ON to pull the node 110 to LOW. (A LOW logic level is a voltage level indicative of ground or substrate potential, $V_{SS}$, and a HIGH logic level is a voltage level indicative of a supply voltage, $V_{CC}$.)

In the above example, before the write operation begins, the pullup pMOSFET 124 is ON to pull the internal node 110 to HIGH. During the write operation, as the nMOSFET 122 is switched ON, there is contention between the pMOSFET 124 and the nMOSFET 122 as the pMOSFET 124 is forced OFF. This contention makes the write operation sensitive to a skewed SF (Slow-Fast) corner where nMOSFETs are slow and pMOSFETs are fast. For such a scenario, it is likely that the SF corner is the worst-case corner for a write operation.

Various embodiments described herein make use of a write tracker 126 to track the nMOSFETs associated with a bitcell, such as the pulldown nMOSFETs and the access nMOSFETs. In addition to the pulldown nMOSFETs within each bitcell (e.g., the pulldown nMOSFET 122), and the access nMOSFETs within each bitcell (e.g., the access nMOSFETs 118 and 120), other nMOSFETs with different circuit functions may contribute to the SF corner. For example, some embodiments may include footer nMOSFETs for power gating, which may also be tracked.

The write tracker 126 is coupled between a dummy wordline 128 and a dummy row cell pulldown 130. The dummy row cell pulldown 130 may be a conventional row of dummy memory bitcells configured to pull LOW its associated dummy bit line 132 during a read or write operation. A logic pulldown 133 may be employed so that the dummy bit line 132 is sufficiently pulled LOW during a read or write operation.

A controller 134 controls a driver 136 to assert the dummy wordline 128 during read or write operations. When the controller 134 senses that the dummy bitline 132 is pulled LOW, other circuits may be activated to complete a write or read operation. For example, in a read operation accessing a row of bitcells, when the controller 134 senses that the dummy bitline 132 is LOW, the controller 134 enables sense amplifiers and latches 138 to read bitlines associated with the accessed row of bitcells. During a read or write operation, the dummy wordline 128 tracks the delay in the wordlines to the bitcell array 102, e.g., the wordline 106. During a read operation, the dummy row cell pulldown 130 tracks the delay in a row of bitcells, but for a write operation the dummy row cell pulldown 130 may not sufficiently track a row of bitcells for a SF corner without the write tracker 126.

The write tracker 126 may include an nMOSFET 140 and a pMOSFET 142 coupled in parallel with each other. The nMOSFET 140 has one source/drain terminal connected to the dummy wordline 128 and its other source/drain terminal connected to the dummy row cell pulldown 130. The pMOSFET 142 has one source/drain terminal connected to the dummy wordline 128 and its other source/drain terminal connected to the dummy row cell pulldown 130. In some cases, the nMOSFET 140 may represent one or more nMOSFETs in series or in parallel.

The gate of the nMOSFET 140 is maintained at the logic level HIGH so that the nMOSFET 140 is switched ON for both read and write operations. The gate of the nMOSFET 140 may be coupled to a supply rail by diffusion in silicon. During a read operation, the gate voltage of the pMOSFET 142, denoted as $V_P$ in FIG. 1, is at a logic level LOW so that the pMOSFET 142 is switched ON. In this way, during a read operation the write tracker 126 is configured as a transmission gate. That is, the dummy wordline 128 is coupled to the dummy row cell pulldown 130 by way of a pMOSFET, e.g., the pMOSFET 142, in parallel with the nMOSFET 140. During a read operation, a slow nMOSFET 140 does not affect the propagation time of a wordline signal to the dummy row cell pulldown 130.

During a write operation, the gate voltage of the pMOSFET 142, denoted as $V_P$ in FIG. 1, is at the logic level HIGH so that the pMOSFET 142 is switched OFF, and only the nMOSFET 140 couples the dummy wordline 128 to the dummy row cell pulldown 130. For a process with slow nMOSFETs, for example if the nMOSFETs have a relatively high threshold voltage, then the nMOSFET 140 does not allow the dummy wordline 128 to reach the full logic level HIGH, and there is an increase in the propagation time of a wordline signal to the dummy row cell pulldown 130. In this way, the nMOSFET 140 tracks the nMOSFETs within a bitcell, such as for example the pulldown nMOSFET 122.

Figure 2:
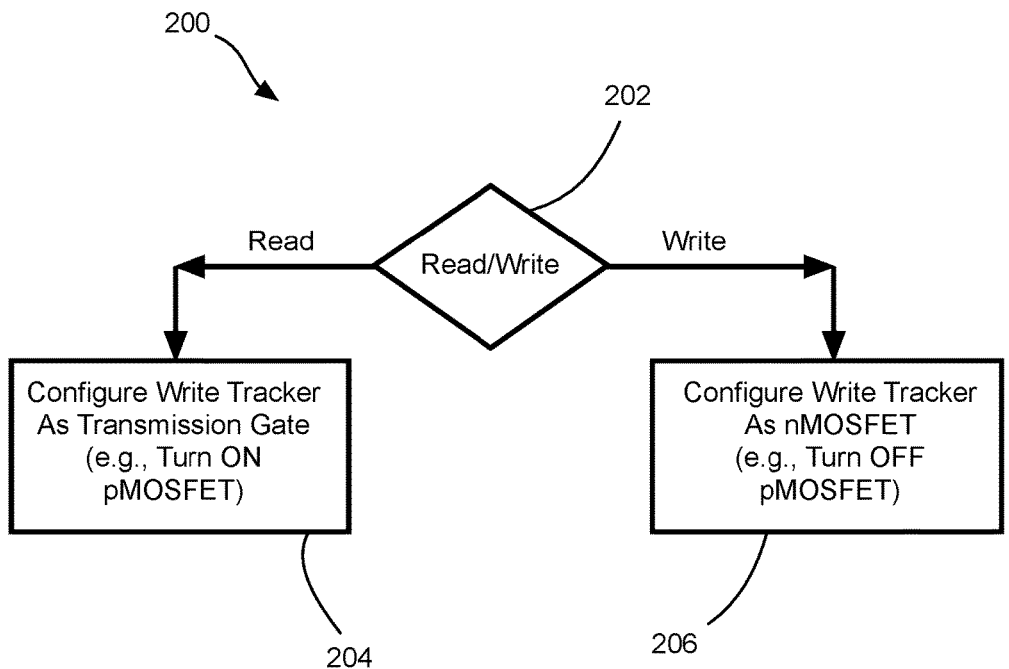
FIG. 2 illustrates a method of utilizing a write tracker with a memory in accordance with various implementations described herein.

FIG. 2 illustrates a method 200 according to the description above with respect to the write tracker 126 as illustrated in the memory of FIG. 1. If in step 202 a read operation on the memory is performed, then in step 204 the write tracker 126 is configured as a transmission gate. The controller 134 switches ON the pMOSFET 142 so as to be coupled in parallel with the nMOSFET 140, and the resulting transmission gate couples the dummy wordline 128 to the dummy row cell pulldown 130. If in step 202 a write operation of the memory is performed, then the pMOSFET 142 is switched OFF, and only the nMOSFET 140 couples the dummy wordline 128 to the dummy row cell pulldown 130 without there being an active pMOSFET in the path of the dummy wordline 128.

It should be understood that even though method 200 may indicate a particular order of operation execution, in some cases, various certain portions of the operations may be executed in a different order, and on different systems. In some other cases, additional operations and/or steps may be added to and/or omitted from method 200.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims. It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a memory, where the memory includes a bitcell array having a plurality of bitcells, a dummy wordline, a dummy row cell pulldown, a write tracker coupling the dummy wordline to the dummy row cell pulldown, and a controller to configure the write tracker as a transmission gate during a read operation on the bitcell array and to configure the write tracker as one or more active nMOSFETs during a write operation on the bitcell array.

Described herein are further various implementations of a memory, where the memory includes a bitcell array having a plurality of bitcells, a dummy wordline, a dummy row cell pulldown, an nMOSFET having a first source/drain terminal connected to the dummy wordline and a second source/drain terminal connected to the dummy row cell pulldown, a pMOSFET having a first source/drain terminal connected to the dummy wordline and a second source/drain terminal connected to the dummy row cell pulldown, and a controller to switch ON the pMOSFET during a read operation on the bitcell array and to switch OFF the pMOSFET during a write operation on the bitcell array, wherein the nMOSFET is ON during both read and write operations.

Described herein are various implementations of a method, where the method includes performing a read operation on a bitcell array, and coupling a dummy wordline to a dummy row cell pulldown when performing the read operation by way of a pMOSFET and an nMOSFET connected in parallel to the pMOSFET, where the pMOSFET and the nMOSFET are both ON during the read operation. The method further includes performing a write operation on the bitcell array, and coupling the dummy wordline to the dummy row cell pulldown when performing the write operation by way of the pMOSFET and the nMOSFET connected in parallel to the pMOSFET, where the pMOSFET is OFF and the nMOSFET is ON during the read operation.

Reference has been made in detail to various implementations, examples of which are illustrated in the accompanying drawings and figures. Numerous specific details are set forth to provide a thorough understanding of the disclosure provided herein. However, the disclosure provided herein may be practiced without these specific details. In some other instances, well-known methods, procedures, components, circuits, and networks have not been described in detail so as not to unnecessarily obscure details of the embodiments.

If one or more circuits are used to realize some or all instances of an embodiment, reference may be made to a node or terminal of a circuit or circuit element as an input port or an output port. For a circuit in which a port is a two terminal structure (e.g., circuits modeled as lumped-parameter systems), a recited node or terminal forms one terminal of the two terminal structure, where it is understood that a ground rail (or substrate) serves as another terminal of the two terminal structure.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described herein are disclosed as example forms of implementing the claims.

What is claimed is:

1. A memory comprising:
   a bitcell array comprising a plurality of bitcells;
   a dummy wordline;
   a dummy row cell pulldown;
   a write tracker coupling the dummy wordline to the dummy row cell pulldown; and
   a controller to configure the write tracker as a transmission gate during a read operation on the bitcell array and to configure the write tracker as one or more active nMOSFETs (Metal-Oxide-Semiconductor-Field-Effect-Transistor) during a write operation on the bitcell array,
   wherein the write tracker comprises an nMOSFET and a pMOSFET, and wherein the gate of the nMOSFET is at a HIGH logic level, and wherein the controller configures the gate of the pMOSFET at the HIGH logic level during the write operation, and wherein the controller configures the gate of the pMOSFET at a LOW logic level during the read operation.

2. The memory as set forth in claim 1, wherein the pMOSFET of the write tracker is coupled in parallel to the nMOSFET of the write tracker.

3. The memory as set forth in claim 2, wherein
   the nMOSFET comprises a first source/drain terminal connected to the dummy wordline, a second source/drain terminal connected to the dummy row cell pulldown, and a gate; and
   the pMOSFET comprises a first source/drain terminal connected to the dummy wordline, a second source/drain terminal connected to the dummy row cell pulldown, and a gate.

4. A memory comprising:
   a bitcell array comprising a plurality of bitcells;
   a dummy wordline;
   a dummy row cell pulldown;
   a write tracker coupling the dummy wordline to the dummy row cell pulldown; and
   a controller to configure the write tracker as a transmission gate during a read operation on the bitcell array and to configure the write tracker as one or more active nMOSFETs (Metal-Oxide-Semiconductor-Field-Effect-Transistor) during a write operation on the bitcell array,
   wherein each bitcell comprises a pulldown nMOSFET, and wherein the write tracker comprises an nMOSFET and a pMOSFET, and wherein a gate of the nMOSFET is at a HIGH logic level, and wherein the controller configures a gate of the pMOSFET at the HIGH logic level during the write operation and configures the gate of the pMOSFET at a LOW logic level during the read operation.

5. A memory comprising:
   a bitcell array comprising a plurality of bitcells;
   a dummy wordline;
   a dummy row cell pulldown;
   a write tracker coupling the dummy wordline to the dummy row cell pulldown; and
   a controller to configure the write tracker as a transmission gate during a read operation on the bitcell array and to configure the write tracker as one or more active nMOSFETs (Metal-Oxide-Semiconductor-Field-Effect-Transistor) during a write operation on the bitcell array, wherein the controller configures the write tracker to track a pulldown nMOSFET in each bitcell during a write operation, wherein the write tracker comprises an nMOSFET and a pMOSFET, and wherein a gate of the nMOSFET is at a HIGH logic level, and wherein the controller configures a gate of the pMOSFET at the HIGH logic level during the write operation and configures the gate of the pMOSFET at a LOW logic level during the read operation.

6. The memory as set forth in claim 5, wherein the pMOSFET of the write tracker is coupled in parallel to the nMOSFET of the write tracker.

7. The memory as set forth in claim 6, wherein
the nMOSFET comprises a first source/drain terminal connected to the dummy wordline, a second source/drain terminal connected to the dummy row cell pulldown, and a gate; and the pMOSFET comprises a first source/drain terminal connected to the dummy wordline, a second source/drain terminal connected to the dummy row cell pulldown, and a gate.

8. A memory comprising:
a bitcell array comprising a plurality of bitcells;
a dummy wordline;
a dummy row cell pulldown;
a write tracker coupling the dummy wordline to the dummy row cell pulldown; and
a controller to configure the write tracker as a transmission gate during a read operation on the bitcell array and to configure the write tracker as one or more active nMOSFETs (Metal-Oxide-Semiconductor-Field-Effect-Transistor) during a write operation on the bitcell array;
a dummy bitline coupled to the dummy row cell pulldown and to the controller; and
a plurality of sense amplifiers and latches coupled to the bitcell array;
wherein the controller enables the plurality of sense amplifiers and latches when the dummy bitline is pulled LOW in response to the read operation.

9. The memory as set forth in claim 8, the write tracker comprising:
an nMOSFET having a first source/drain terminal connected to the dummy wordline, a second source/drain terminal connected to the dummy row cell pulldown, and a gate at a HIGH logic level; and
a pMOSFET having a first source/drain terminal connected to the dummy wordline, a second source/drain terminal connected to the dummy row cell pulldown, and a gate;
wherein the controller configures the gate of the pMOSFET at the HIGH logic level during the write operation and configures the gate of the pMOSFET at a LOW logic level during the read operation.

10. A memory comprising:
a bitcell array comprising a plurality of bitcells;
a dummy wordline;
a dummy row cell pulldown;
an nMOSFET (Metal-Oxide-Semiconductor-Field-Effect-Transistor) having a first source/drain terminal connected to the dummy wordline and a second source/drain terminal connected to the dummy row cell pulldown;

a pMOSFET having a first source/drain terminal connected to the dummy wordline and a second source/drain terminal connected to the dummy row cell pulldown; and a controller to switch ON the pMOSFET during a read operation on the bitcell array and to switch OFF the pMOSFET during a write operation on the bitcell array, wherein the nMOSFET is ON during both read and write operations.

11. The memory as set forth in claim 10, wherein each bitcell includes an internal node;
a pullup pMOSFET having a drain connected to the internal node; and
a pulldown nMOSFET having a drain connected to the internal node.

12. The memory as set forth in claim 11, further comprising:
a dummy bitline connected to the dummy row cell pulldown; and
a plurality of sense amplifiers and latches coupled to the bitcell array;
wherein the controller enables the plurality of sense amplifiers and latches when the dummy bitline is pulled LOW in response to the read operation.

13. A method comprising:
performing a read operation on a bitcell array;
coupling a dummy wordline to a dummy row cell pulldown when performing the read operation by way of a pMOSFET (Metal-Oxide-Semiconductor-Field-Effect-Transistor) and an nMOSFET connected in parallel to the pMOSFET, where the pMOSFET and the nMOSFET are both ON during the read operation;
performing a write operation on the bitcell array; and
coupling the dummy wordline to the dummy row cell pulldown when performing the write operation by way of the pMOSFET and the nMOSFET connected in parallel to the pMOSFET, where the pMOSFET is OFF and the nMOSFET is ON during the read operation.

14. The method as set forth in claim 13, further comprising:
during the write operation, for a bitcell in the bitcell array, pulling LOW an internal node in the bitcell by switching ON a pulldown nMOSFET connected to the internal node.

15. The method as set forth in claim 14, further comprising:
pulling a dummy bitline LOW by the dummy row cell pulldown in response to the read operation and the write operation; and
reading the bitcell array in response to the dummy bitline being pulled LOW.

16. The method as set forth in claim 15, further comprising:
completing the write operation in response to the dummy bitline being pulled LOW.

17. The method as set forth in claim 13, further comprising:
pulling a dummy bitline LOW by the dummy row cell pulldown in response to the read operation and the write operation; and
reading the bitcell array in response to the dummy bitline being pulled LOW.

18. The method as set forth in claim 17, further comprising:
 completing the write operation in response to the dummy bitline being pulled LOW.

\* \* \* \* \*